(12) United States Patent
Schlienger et al.

(10) Patent No.: US 8,752,610 B2
(45) Date of Patent: Jun. 17, 2014

(54) SYSTEM, METHOD, AND APPARATUS FOR DIRECTIONAL DIVERGENCE BETWEEN PART MOTION AND CRYSTALLIZATION

(75) Inventors: Max Eric Schlienger, Napa, CA (US); Paul Anthony Withey, Derby (GB)

(73) Assignee: Rolls-Royce Corporation, Indianapolis, IN (US)

( * ) Notice: Subject to any disclaimer, the term of this patent is extended or adjusted under 35 U.S.C. 154(b) by 182 days.

(21) Appl. No.: 12/853,112

(22) Filed: Aug. 9, 2010

(65) Prior Publication Data
US 2011/0030910 A1    Feb. 10, 2011

Related U.S. Application Data

(60) Provisional application No. 61/232,447, filed on Aug. 9, 2009.

(51) Int. Cl.
*B22D 27/00* (2006.01)
(52) U.S. Cl.
USPC ............... 164/122.1; 164/47; 164/122
(58) Field of Classification Search
USPC .................. 164/47, 122.1, 122, 125
See application file for complete search history.

(56) References Cited

U.S. PATENT DOCUMENTS

| | | | |
|---|---|---|---|
| 3,677,324 A | 7/1972 | Higginbotham et al. |
| 4,683,936 A | 8/1987 | Cybulsky et al. |
| 4,774,992 A | 10/1988 | George |
| 4,789,022 A | 12/1988 | Ohno |
| 5,072,771 A | 12/1991 | Prasad |
| 5,309,976 A | 5/1994 | Prichard et al. |
| 6,598,657 B2 | 7/2003 | Dodd |
| 6,651,728 B1 | 11/2003 | Graham |
| 6,896,030 B2 | 5/2005 | Soderstrom et al. |
| 7,017,646 B2 | 3/2006 | Balliel et al. |
| 2002/0134524 A1 | 9/2002 | Dodd |
| 2004/0163790 A1 | 8/2004 | Boswell |
| 2006/0021730 A1 | 2/2006 | Marcin, Jr. |
| 2006/0151137 A1 | 7/2006 | Kuroki et al. |

OTHER PUBLICATIONS

International Search Report and Written Opinion, PCT/US2010/044898, Nov. 4, 2010, Rolls-Royce Corporation.

*Primary Examiner* — Nicholas P D'Aniello
(74) *Attorney, Agent, or Firm* — Krieg DeVault LLP

(57) ABSTRACT

A method includes providing a mold including a molten casting material, moving the mold in a first direction, and guiding a solidification interface across the mold in a second direction in response to the moving the mold. The second direction is deviated from the first direction, and the solidification interface includes a transition to a negative heat transfer region. The mold moves in the first direction at a constant speed, and the mold includes heat transfer features such that a solidification time of the molten casting material at the conditions of the solidification interface is approximately constant as a function of the second direction.

19 Claims, 1 Drawing Sheet

SYSTEM, METHOD, AND APPARATUS FOR DIRECTIONAL DIVERGENCE BETWEEN PART MOTION AND CRYSTALLIZATION

CROSS REFERENCE TO RELATED APPLICATIONS

The present application claims the benefit of U.S. Provisional Patent Application 61/232,447, filed Aug. 9, 2009, and is incorporated herein by reference.

BACKGROUND

The present application is directed generally to solidification of molded parts, and particularly but not exclusively to forming cast, single crystal, metal components. Many casting processes create a single crystal microstructure through temperature control of the cast component. The solidification front is controlled by passing the part through a transition between heat sourcing and heat sinking, where the solidification is occurring near the transition area. The direction of the solidification is therefore limited to the direction of motion of the part, or a small angular departure from the motion of the part. This restriction limits potential furnace design possibilities. Therefore, further technological developments are desirable in this area.

SUMMARY

One embodiment is a unique method to directionally crystallize a component at an angle substantially departed from a movement direction of the component. Further embodiments, forms, objects, features, advantages, aspects, and benefits shall become apparent from the following description and drawings.

BRIEF DESCRIPTION OF THE DRAWINGS

The description herein makes reference to the accompanying drawings wherein like reference numerals refer to like parts throughout the several views, and wherein.

DESCRIPTION OF THE ILLUSTRATIVE EMBODIMENTS

Figure 1:
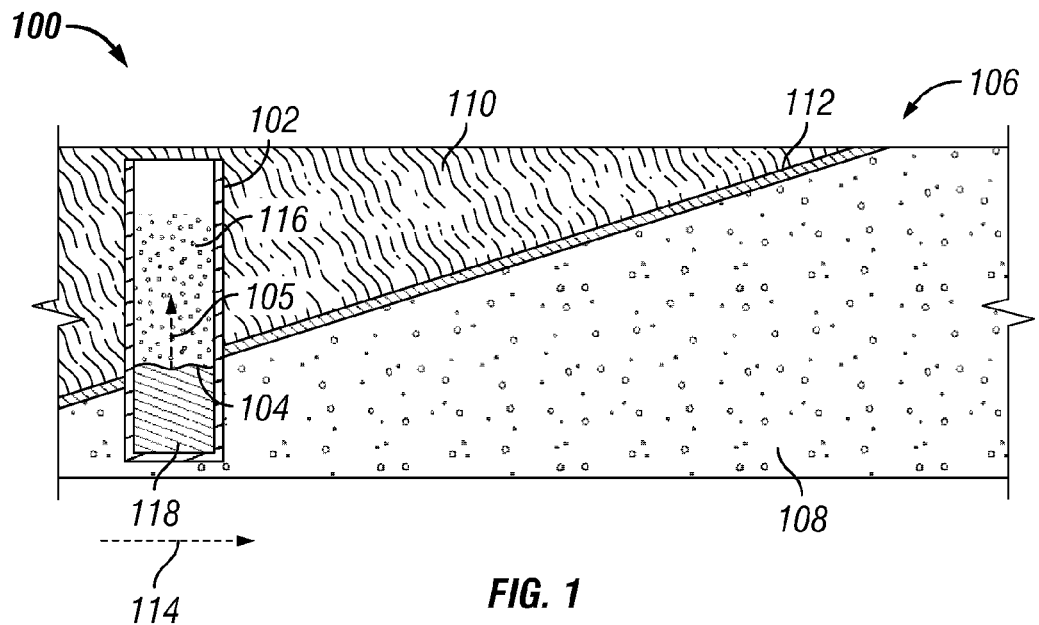
FIG. 1 is an illustrative view of one embodiment of process for casting a molten material into a mold.

For the purposes of promoting an understanding of the principles of the invention, reference will now be made to the embodiments illustrated in the drawings and specific language will be used to describe the same. It will nevertheless be understood that no limitation of the scope of the invention is thereby intended, any alterations and further modifications in the illustrated embodiments, and any further applications of the principles of the invention as illustrated therein as would normally occur to one skilled in the art to which the invention relates are contemplated herein.

A system 100 includes a furnace 106 having a solidification interface 112, and a mold 102 including a molten casting material 116, solidified casting material 118, and a solidification front 104 between the molten casting material 116 and the solidified casting material 118. The furnace 106 can include various features known in the art, not shown to avoid obscuring aspects of the present application, such as a mold pre-heating and metal pouring area. The illustrated furnace 106 is shown with only a portion of the axial length (in the first direction 114), the furnace 106 is opened and shown in schematically. The furnace 106 further includes a guide (not shown) that moves the mold in a first direction 114.

The first direction 114 is illustrated as left to right in FIG. 1, but the first direction may be any direction, including without limitation an incline, a rotary direction (e.g. clockwise, counter-clockwise, etc.), or a trajectory through the furnace 106 in some irregular pattern. The solidification interface 112 traverses across the mold 102 in a second direction 105 in response to the mold 102 moving in the first direction 114. In the illustration of FIG. 1, as the mold 102 passes through furnace 106 in the first direction 114, the position of the solidification interface 112 rises along the mold 102. A heat source region 110 maintains the molten casting material 116 in a liquid state, and can provide heat and/or insulation to the mold 102. A heat sink region 108 cools the mold 102 or allows the mold 102 to cool, and contributes to the solidification of the molten casting material 116. A solidification front 104 within the casting is illustrated, which advances in the second direction 105 as the mold 102 moves in the first direction 114. The heat source region 110 and the heat sink region 108 are separated by the solidification interface 112, which may be a baffle. The solidification interface 112 may be inclined as illustrated in FIG. 1.

The second direction is deviated from the first direction 114. In the illustration of FIG. 1, the second direction 105 is perpendicular to the first direction 114, but any significant deviation is contemplated herein. In certain embodiments, the first direction 114 and the second direction 105 are deviated by at least 15 degrees.

In certain embodiments, the guide is structured to move the mold 102 in the first direction at a constant speed. The movement of the mold 102 at constant speed is not required, but is desirable to allow the furnace 106 to be operated with multiple molds 102 advancing through the furnace 106 simultaneously, at different stages of the casting process. The mold 102 may include heat transfer features such that a solidification time of the molten casting material 116 at the conditions of the solidification interface 112 is approximately constant as a function of the second direction 105. For example, in portions of the mold 102 where the molten casting material 116 takes longer to cool the mold 102 may include features to increase heat transfer, and in portions of the mold 102 where the molten casting material cools more rapidly the mold 102 may include features that reduce heat transfer.

Figure 2:
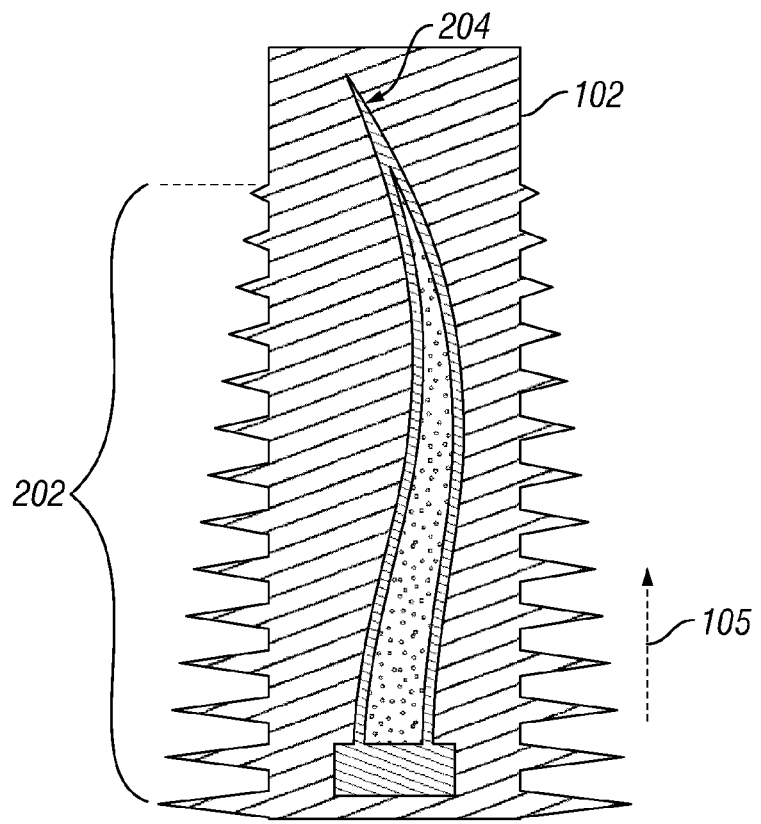
FIG. 2 is an illustrative view of one embodiment of a casting mold including a plurality of heat transfer baffles.

The heat transfer features include, in certain exemplary embodiments, a heat shield, a baffle, and/or a composition variation. For example, a heat shield may include a thicker mold 102 wall than required for the casting design, a reflective barrier or standoff portion that reduces radiation heating of the mold 102 from the furnace 106, or other shielding known in the art. Referencing FIG. 2, a series of baffles 202 are illustrated that vary the heat transfer as a function of the second direction 105. In the illustration of FIG. 2, the nominal cooling time (in the absence of the baffles 202) increases in the direction opposite the second direction 105 because of the greater amount of casting material 204 at the lower portion of the mold 102. The illustrated baffles 202 are not sized to scale but merely illustrate an increasing heat transfer environment in the expected direction where increased heat transfer counteracts the nominal cooling time to help keep the cooling time of the casting material 204 constant as a function of the second direction 105. In additional or alternate embodiments, the material included in the mold 102 may be varied in the second direction 105; for example, more conductive metal can be included in a ceramic substrate of the mold 102 where increased heat transfer is desired. The determination of the heat transfer rates and heat transfer features to include on the mold 102 are specific to a given embodiment and are readily determined based upon parameters generally known for a specific embodiment with the benefit of the disclosures herein.

Consistent cooling rates of the casting material 204 are generally desirable in most crystallization processes, and the required degree of consistency for a given system is understood to one of skill in the art based upon the parameters of the system. While heat transfer modifications to the mold 102 such as illustrated in FIG. 2 can be utilized to create uniformity of the cooling rates, the system 100 can additionally or alternatively include modifications to the heat sink region 108 and/or to the solidification interface 112 to create more uniform cooling rates. For example, the solidification interface 112 can follow a function rather than a straight line as illustrated in FIG. 1. The solidification interface 112 can rise more slowly in the beginning (to the left side of the furnace 106), rise more quickly at the beginning, or follow any other prescribed path from the bottom of the mold 102 to the top of the mold 102 along the first direction 114. The solidification interface 112 should advance monotonically, i.e. not exposing any cooled portions of the mold 102 to the heat source region 110, but otherwise the shape of the solidification interface 112 is not limited.

The heat sink region 108, in certain embodiments, varies as a function of the first direction 114 such that a solidification time of the molten casting material at the conditions of the solidification interface 112 is approximately constant as a function of the second direction 105. Again, the approximately constant cooling rate is a cooling rate that supports the crystallization scheme for the component to develop the desired micro-structure, and the cooling time along the mold 102 in the second direction 105 is not generally required to be exactly constant as will be understood to those of skill in the art.

The furnace 106 may be a rotary furnace, may receive a number of molds 102 in a sequential fashion, and/or may receive a number of molds 102 in a continuous operation. The second direction 105 includes a direction between about 15 degrees and 90 degrees of deviation from the first direction 114.

An exemplary technique to provide directional divergence between a solidification direction and a part motion is described. The technique includes an operation to provide a mold including a molten casting material, an operation to move the mold in a first direction, and an operation to guide a solidification interface across the mold in a second direction in response to the moving the mold. The second direction is deviated from the first direction, and wherein the solidification interface includes a transition to a negative heat transfer region. The technique further includes an operation to move the mold in the first direction at a constant speed. In certain embodiments, the technique further includes an operation to provide the mold such that a solidification time of the molten casting material at the conditions of the solidification interface is approximately constant as a function of the second direction. In certain embodiments, the operation to provide the mold includes providing at least one heat transfer feature to the mold such as a heat shield, a baffle, and/or a composition variation. The composition variation in the mold can be performed by impregnating the mold with a heat-transfer altering material, by adding a material to a liquid resin used in a stereo-lithography operation, or by other methods understood in the art.

The technique further includes an operation to provide conditions on each side of the solidification interface that vary as a function of the first direction such that a solidification time of the molten casting material in the mold at the conditions of the solidification interface is approximately constant as a function of the second direction. The technique further includes an operation to sequentially provide a number of molds including molten casting material, to sequentially move the number of molds in the first direction, and to sequentially guide the solidification interface across the number of molds. In certain embodiments, the first direction is a rotary direction and/or an incline. The second direction in certain embodiments is a direction between about 15 degrees and 90 degrees of deviation from the first direction. The technique further includes an operation to form a component from the molten casting material that is a single crystal, directionally solidified, and/or equiaxed casting.

As is evident from the figures and text presented above, a variety of embodiments according to the present invention are contemplated.

A method includes providing a mold including a molten casting material, moving the mold in a first direction, and guiding a solidification interface across the mold in a second direction in response to the moving the mold, wherein the second direction is deviated from the first direction, and wherein the solidification interface comprises a transition to a negative heat transfer region. The method further includes moving the mold in the first direction at a constant speed. In certain embodiments, the method further includes providing the mold such that a solidification time of the molten casting material at the conditions of the solidification interface is approximately constant as a function of the second direction, which may further include providing at least one heat transfer feature to the mold selected from the heat transfer features consisting of a heat shield, a baffle, and a composition variation.

Certain exemplary embodiments further include providing conditions on each side of the solidification interface that vary as a function of the first direction such that a solidification time at the conditions of the solidification interface is approximately constant as a function of the second direction. The method may further include sequentially providing a number of molds including molten casting material, sequentially moving the number of molds in the first direction, and sequentially guiding the solidification interface across the number of molds. In certain embodiments, the first direction is a rotary direction and/or an incline. The second direction in certain embodiments is a direction between about 15 degrees and 90 degrees of deviation from the first direction. The method further includes forming a component from the molten casting material that is a single crystal, directionally solidified, and/or equiaxed casting.

Another exemplary embodiment is a system including a furnace having a solidification interface, a mold including a molten casting material, and a guide that moves the mold in a first direction. The solidification interface traverses across the mold in a second direction in response to the mold moving in the first direction, where the second direction is deviated from the first direction, and where the solidification interface includes a heat source region on a first side and a heat sink region on a second side. In certain embodiments, the solidification interface is a baffle separating the heat source region from the heat sink region. The solidification interface may be inclined.

In certain embodiments, the guide is structured to move the mold in the first direction at a constant speed. The mold may include heat transfer features such that a solidification time of the molten casting material at the conditions of the solidification interface is approximately constant as a function of the second direction. The heat transfer features include, in certain exemplary embodiments, a heat shield, a baffle, and/or a composition variation. The heat sink region, in certain embodiments, varies as a function of the first direction such that a solidification time of the molten casting material at the conditions of the solidification interface is approximately constant as a function of the second direction. The furnace may be a rotary furnace, may receive a number of molds in a sequential fashion, and/or may receive a number of molds in a continuous operation. The second direction includes a direction between about 15 degrees and 90 degrees of deviation from the first direction.

While the invention has been illustrated and described in detail in the drawings and foregoing description, the same is to be considered as illustrative and not restrictive in character, it being understood that only certain exemplary embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method, comprising:
   sequentially providing a plurality of molds including molten casting material;
   sequentially moving the plurality of molds in a first direction; and
   sequentially guiding a solidification interface across the molds in a second direction in response to the moving the molds effective to advance a solidification front of the casting material along a respective mold axis of a respective mold extending in the second direction,
   wherein the second direction is deviated from the first direction,
   wherein the solidification interface comprises a transition to a negative heat transfer region, and
   wherein the solidification interface is deviated from the first direction at a non-perpendicular angle and, at the location at which the solidification interface is guided across a respective mold, the solidification interface is deviated from the respective mold axis of the respective mold extending in the second direction at a non-perpendicular angle.

2. The method of claim 1, further comprising moving the mold in the first direction at a constant speed.

3. The method of claim 2, further comprising providing the mold such that a solidification time of the molten casting material at the conditions of the solidification interface is approximately constant as a function of the second direction.

4. The method of claim 3, wherein the providing comprises including at least one heat transfer feature to the mold selected from the heat transfer features consisting of a heat shield, a baffle, and a composition variation.

5. The method of claim 2, further comprising providing conditions on each side of the solidification interface that vary as a function of the first direction such that a solidification time at the conditions of the solidification interface is approximately constant as a function of the second direction.

6. The method of claim 1, wherein moving the mold in the first direction comprises moving the mold in a rotary direction.

7. The method of claim 1, wherein moving the mold in the first direction comprises moving the mold at an incline.

8. The method of claim 1, wherein the second direction comprises a direction between about 15 degrees and 90 degrees of deviation from the first direction.

9. The method of claim 1, further comprising forming a component from the molten casting material having a microstructure selected from the microstructures consisting of: a single crystal, a directional solidification, and an equiax crystallization.

10. A method, comprising:
    providing a mold including a casting material, solidified casting material, and a solidification front which traverses the mold between the molten casting material and the solidified casting material;
    moving the mold in a first direction; and
    guiding a solidification interface across the molds in a second direction in response to the moving the mold effective to advance the solidification front of the casting material along a mold axis extending in the second direction,
    wherein the second direction is deviated from the first direction substantially perpendicular to the first direction,
    wherein the solidification interface comprises a transition to a negative heat transfer region;
    wherein the solidification interface is deviated from the first direction at a non-perpendicular angle and, at the location at which the solidification interface is guided across the mold, the solidification interface is deviated from the mold axis extending in the second direction at a non-perpendicular angle.

11. The method of claim 10, further comprising moving the mold in the first direction at a constant speed.

12. The method of claim 11, further comprising providing the mold such that a solidification time of the molten casting material at the conditions of the solidification interface is approximately constant as a function of the second direction.

13. The method of claim 12, wherein the providing comprises including at least one heat transfer feature to the mold selected from the heat transfer features consisting of a heat shield, a baffle, and a composition variation.

14. The method of claim 11, further comprising providing conditions on each side of the solidification interface that vary as a function of the first direction such that a solidification time at the conditions of the solidification interface is approximately constant as a function of the second direction.

15. The method of claim 10, further comprising sequentially providing a plurality of molds including molten casting material, sequentially moving the plurality of molds in the first direction, and sequentially guiding the solidification interface across the plurality of molds.

16. The method of claim 10, wherein moving the mold in the first direction comprises moving the mold in a rotary direction.

17. The method of claim 10, wherein moving the mold in the first direction comprises moving the mold at an incline.

18. The method of claim 10, wherein the second direction comprises a direction 90 degrees of deviation from the first direction.

19. The method of claim 10, further comprising forming a component from the molten casting material having a microstructure selected from the microstructures consisting of: a single crystal, a directional solidification, and an equiax crystallization.

* * * * *